(12) United States Patent
Takachi (10) Patent No.: US 8,896,745 B2
(45) Date of Patent: Nov. 25, 2014

(54) IMAGE PICKUP APPARATUS AND CAMERA MODULE

(75) Inventor: Taizo Takachi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/551,912

(22) Filed: Jul. 18, 2012

(65) Prior Publication Data

US 2013/0038764 A1   Feb. 14, 2013

(30) Foreign Application Priority Data

Aug. 12, 2011   (JP) ................................. 2011-177136

(51) Int. Cl.
  *H04N 5/225*      (2006.01)
  *H01L 27/146*     (2006.01)
  *H04N 5/357*      (2011.01)

(52) U.S. Cl.
  CPC .... *H01L 27/14618* (2013.01); *H01L 27/14685* (2013.01); *H01L 27/14625* (2013.01); *H04N 5/3572* (2013.01); *H04N 5/2257* (2013.01)
  USPC ........................................................ 348/342

(58) Field of Classification Search
  USPC .................. 348/294, 335, 338, 339, 340, 342; 359/589
  See application file for complete search history.

(56) References Cited

U.S. PATENT DOCUMENTS

| 6,342,406 | B1 * | 1/2002 | Glenn et al. | ..................... 438/57 |
| 7,576,402 | B2 * | 8/2009 | Noma | ........................... 257/432 |
| 2003/0164891 | A1 * | 9/2003 | Akimoto | ........................ 348/340 |
| 2005/0018302 | A1 * | 1/2005 | Yano et al. | .................... 359/588 |
| 2005/0084773 | A1 * | 4/2005 | Krauth | .............................. 430/5 |
| 2005/0185267 | A1 * | 8/2005 | Ockenfuss et al. | ........... 359/359 |
| 2012/0205766 | A1 | 8/2012 | Takachi | |

FOREIGN PATENT DOCUMENTS

| JP | 07-209516 | * 8/1995 | ............... G02B 5/28 |
| JP | 2005-26314 | 1/2005 | |
| JP | 2006-210888 | 8/2006 | |
| JP | 2007-110117 | 4/2007 | |
| JP | 2009-290031 | 12/2009 | |

OTHER PUBLICATIONS

"Angular Shift". http://www.noc-ltd.com/technical/angular-shift. (retrieved Mar. 10, 2014).*

* cited by examiner

*Primary Examiner* — Lin Ye
*Assistant Examiner* — Chriss Yoder, III
(74) *Attorney, Agent, or Firm* — Oblon, Spivak, McClelland, Maier & Neustadt, L.L.P.

(57) ABSTRACT

An image pickup apparatus includes an optical sensor including a light receiving unit, a sealing material configured to protect the optical sensor on a side of the light receiving unit, an intermediate layer formed at least between the light receiving unit and a first surface of the sealing material, the first surface being an opposed surface to the light receiving unit, and a control film configured to cause a cutoff wavelength to shift to a short wave side in accordance with an incident angle of light that is incident thereon obliquely, in which the control film includes a first control film formed on the first surface of the sealing material, the first surface being the opposed surface to the light receiving unit, and a second control film formed on a second surface of the sealing material, the second surface being opposite to the first surface.

8 Claims, 10 Drawing Sheets

200 Image pickup lens
220
210 Lens barrel
100

FIG.13

200A Image pickup lens
220
210A Lens barrel
Wiring WB  250 IRCF  240 Sensor  230 Substrate

IMAGE PICKUP APPARATUS AND CAMERA MODULE

BACKGROUND

The present disclosure relates to an image pickup apparatus and a camera module in which a solid-state image pickup element (optical sensor) such as a CCD (charge coupled device) and a CMOS (complementary metal oxide semiconductor) image sensor (CIS) is configured as a chip scale package.

As a simple package method for an optical sensor, a chip scale package (CSP) structure has been proposed, and the optical sensor having the CSP structure is produced in volume.

Unlike a cavity package which is formed of ceramics or mold resin in related art, in the CSP structure, as a cavity structure having a partition wall between adjacent chips in unit of wafer, a Si wafer of a sensor unit and glass are bonded with resin.

Further, the CSP structure has a thru silicon via (hereinafter, referred to as TSV) formed therein, re-wiring is performed on a surface opposite to a sensor surface, a solder ball is attached, and the matter thus obtained is divided into pieces by dicing ultimately.

Figure 1:
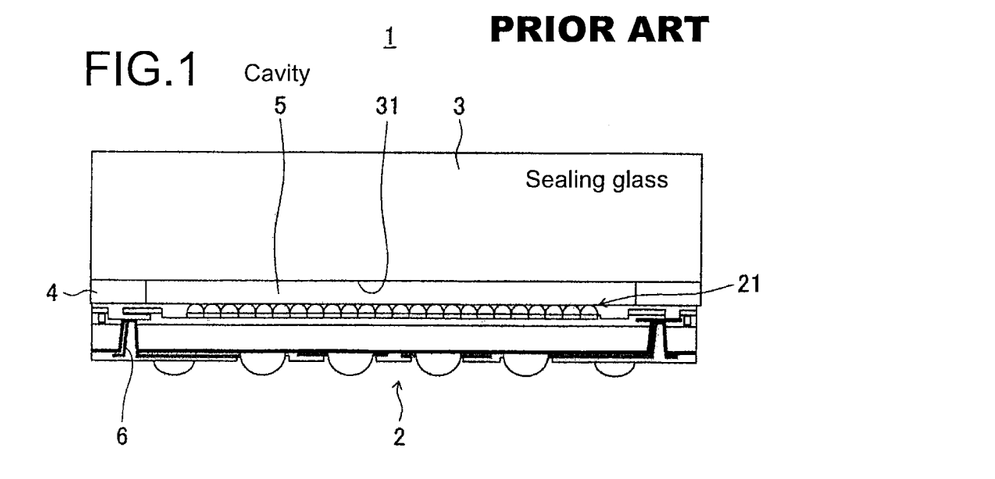
FIG. 1 is a diagram showing a basic structure of a cavity CSP structure.

FIG. 1 is a diagram showing a basic structure of the cavity CSP structure.

In a CSP structure 1, as a sealing material for protecting an upper portion of a light receiving unit 21 on the front surface of an optical sensor (sensor chip) 2, a sealing glass (cover glass) 3 is disposed.

In the CSP structure 1, the sealing glass 3 is disposed on a peripheral portion excluding the light receiving unit 21 of the optical sensor 2 with a resin 4 intervened therebetween. Therefore, in the CSP structure 1, a cavity 5 is formed between the light receiving unit 21 of the optical sensor 2 and an opposed surface 31 of sealing glass 3 with respect to the light receiving unit 21.

In the CSP structure, an electrode 6 is formed with a TSV that penetrates the sensor chip from the front surface to the back surface thereof, thereby eliminating wirings using wire bond, which makes it possible to bond the glass in a clean room in a wafer state.

As a result, it is possible to attain a size reduction, a cost reduction, and a dustless condition as compared to a COB (Chip On Board) type package in related art.

However, in the CSP structure, in forming the TSV, if the cavity 5 is formed between the cover glass and the chip (optical sensor) as described above to reduce the thickness of the chip, when a thermal process such as reflow is carried out, a warp of the chip may undesirably occur due to an influence of a thermal stress.

This point will be described in more detail.

In the CSP structure shown in FIG. 1, to satisfy a condition of a via process of a deep-reactive ion etching (Deep-RIE) in forming the TSV on Si or an insulation film formation condition of CVD, an aspect ratio of a via diameter to an Si thickness has to be reduced for high productivity.

To attain this, the Si thickness is often reduced to approximately 50 to 100 μm in performing back grind (BG).

Figure 2:
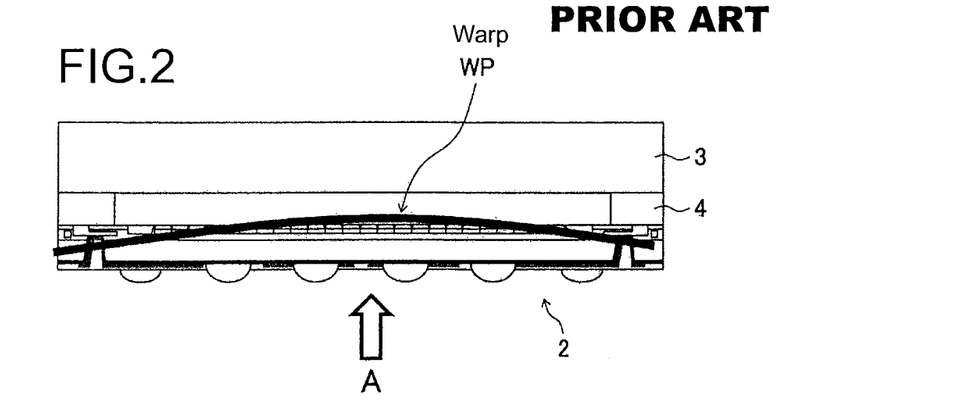
FIG. 2 is a diagram for explaining an occurrence of a warp in a cavity structure of an optical sensor having a large size.

In the case where the optical sensor is small, a large warp is unlikely to occur in Si with a mechanical strength of Si. If the size of the optical sensor is increased, the warp WP is generated due to deflection in the back grind process in which a force is applied in a direction indicated by the arrow A of FIG. 2 or a stress with a substrate on which the CSP is mounted.

If the warp is generated, a position where a lens is focused is displaced optically in the center of the sensor and in the vicinity thereof. Therefore, in the case where the focus is positioned at the center, such a disadvantage that the vicinity blurs is caused.

Figure 3:
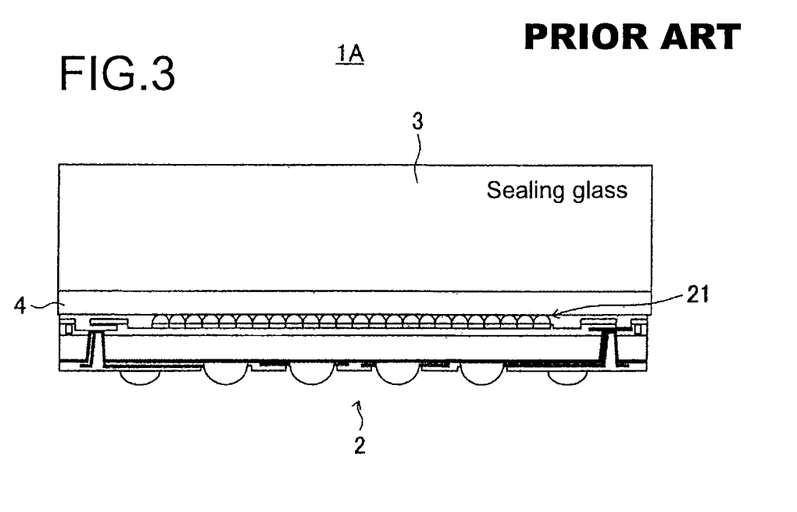
FIG. 3 is a diagram showing a cavityless CSP structure having no cavity.

As a method for overcoming this, as shown in FIG. 3, a CSP structure 1A with no cavity which is obtained by filling the cavity 5 with the resin 4 has been proposed. Hereinafter, the CSP structure with no cavity is referred to as a cavityless CSP structure in some cases.

By using the cavityless CSP structure with no cavity, it is possible to suppress the occurrence of the warp because the thermal stress generated in the cavity in the CSP structure having the cavity is significantly reduced.

That is, in the cavityless CSP structure, the warp due to the weakness in mechanical rigidity of Si of the cavity structure is not caused because the rigidity of glass is added to increase the mechanical rigidity by bonding Si with the glass having the thickness of 300 to 800 μm.

Further, in the cavity CSP structure, light is collected with a lens function using a difference between a refractive index of approximately 1.6 of an on-chip lens (OCL) formed of a resin material in the past and a refractive index of 1 of air.

In contrast, in the cavityless CSP structure, light collecting power is small in the refractive index of approximately 1.5 of the resin that fills between the glass and the sensor surface, and the sensitivity of the optical sensor is reduced. In view of this, in the cavityless CSP structure, a high refractive index of 1.7 to 2.1 is obtained by forming the OCL by using a material such as SiN, thereby achieving a structure which maintains the light collecting power.

SUMMARY

However, in the cavityless CSP structure, flare (fake image) light is generated which is not generated in a normal sensor package structure.

The generation of the flare light will be explained while referring to FIGS. 4A and 4B and FIGS. 5A and 5B.

Figure 4A:
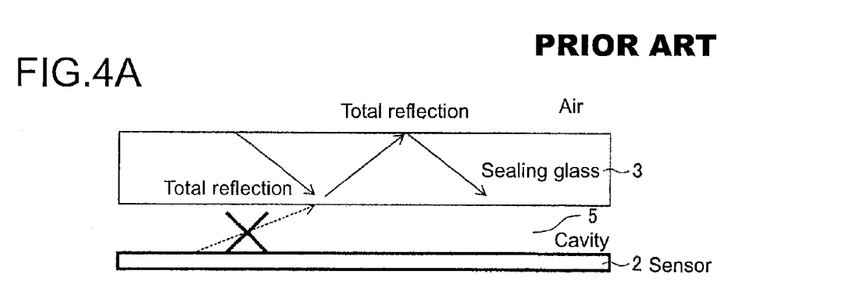
FIGS. 4 are diagrams for explaining a total reflection mode on an upper surface of a sealing glass in accordance with existence/nonexistence of a cavity in the CSP structure.
Figure 4B:
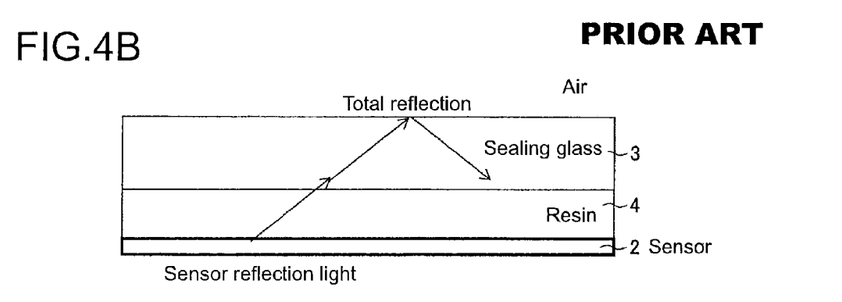

FIGS. 4A and 4B are diagrams for explaining a total reflection mode on an upper surface of a sealing glass in accordance with existence or nonexistence of a cavity in a CSP structure. FIG. 4A shows a state of the total reflection mode on the upper surface of the sealing glass in a CSP structure having the cavity, and FIG. 4B shows a state of the total reflection mode on the upper surface of the sealing glass in a cavityless CSP structure having no cavity.

Figure 5A:
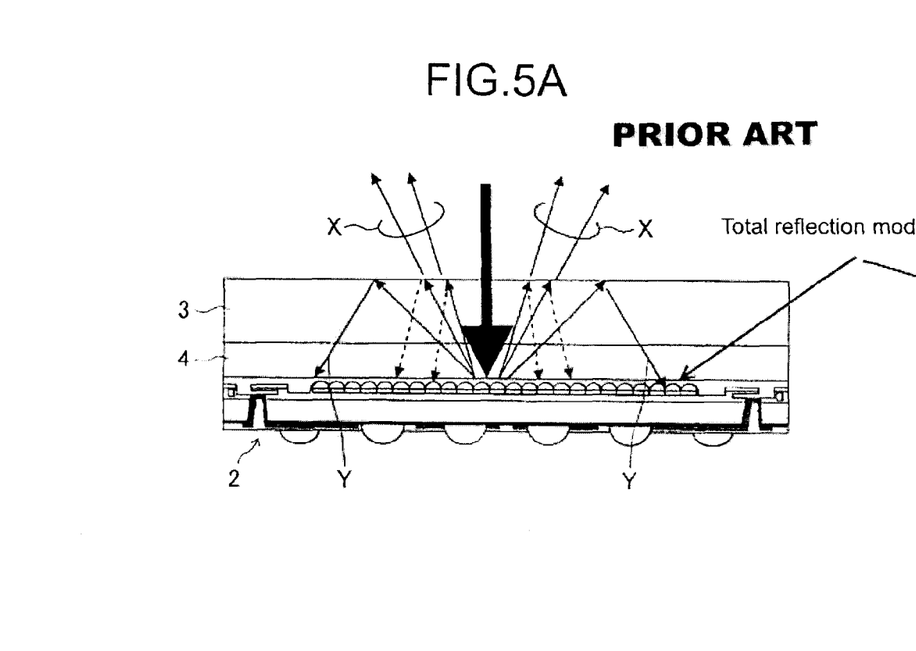
FIGS. 5 are diagrams showing a factor and flare light generated in the cavityless CSP structure having no cavity.
Figure 5B:
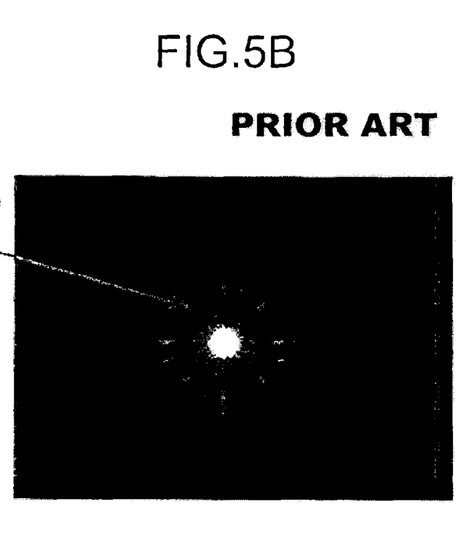

FIG. 5A is a schematic diagram for explaining a factor of generation of flare with high brightness in the cavityless CSP structure having no cavity, and FIG. 5B is a diagram showing flare light generated in the cavityless CSP structure.

In the cavity CSP structure having the cavity between the optical sensor and the glass, as shown in FIG. 4A, the total reflection on the upper surface of the sealing glass is not returned to the sensor surface.

That is, in the cavity CSP structure shown in FIG. 4A, light reflected on a light receiving unit of the optical sensor is reflected on a lower surface of the sealing glass 3. Even if the total reflection does not occur on the surface, light totally reflected on the upper surface of the sealing glass 3 is also totally reflected on the lower surface of the sealing glass 3, and therefore does not return to the optical sensor.

In contrast, a factor of generating the flare light in the cavityless CSP structure is derived from the fact that a refractive index under the sealing glass is almost the same as that of the sealing glass 3, so diffraction light reflected on the optical sensor can be totally reflected on the upper surface of the sealing glass 3 as shown in FIG. 4B.

That is, in the cavityless CSP structure shown in FIG. 4B, the refractive index of a transparent resin 4 is close to that of the sealing glass 3, specifically, approximately 1.5, so almost no reflection is caused on an interface of the lower surface of the sealing glass, and light reflected on the sensor surface directly goes to the upper surface of the glass.

A critical angle of the total reflection mode on the interface can be represented as follows:

$$\sin \theta tir = 1/ng \qquad (1)$$

where θtir represents the critical angle, and ng represents the refractive index of the glass.

Here, the assumption is made that ng=1.51, the critical angle θtir=41 deg is obtained.

Light at an angle equal to or larger than the critical angle out of the light reflected on the optical sensor 2 is totally reflected on the upper surface of the sealing glass 3 and returns to the sensor surface while maintaining a strong light intensity.

FIG. 5A is a schematic diagram of the flare with high brightness in the cavityless CSP structure.

Approximately 4% of Light indicated by the arrow X in the figure at an angle equal to or smaller than the critical angle is reflected on the upper surface of the sealing glass and returned, and approximately 100% of light in the total reflection mode which is indicated by the arrow Y in the figure and is equal to or larger than the critical angle is reflected on the upper surface of the sealing glass 3 and returned.

Therefore, as shown in FIG. 5B, in the case where the flare is viewed with an image of the optical sensor 2, the flare having a high brightness is generated at a position where a phase is largely displaced with respect to light having the high brightness on the center while exceeding the critical angle.

In other words, light which blurs is dispersed in all directions from a center light source, that is, so-called a sparker-like flare is generated.

To avoid the generation of the flare, an IRCF is formed (applied) on the lower surface of the sealing glass, with the result that it is possible to take such a measure as to cause light to be reflected on the surface. With this structure, the phase of original light having the high brightness and the phase of the flare are reduced, thereby causing the flare to be less obvious and making it possible to take the measure.

Also in the CSP structure, a technique has been studied in which when applying the IRCF, matters obtained by dividing into pieces are bonded, or the bonding is performed in unit of a wafer for efficient bonding (see, Japanese Patent Application Laid-open Nos. 2009-290031 and 2007-110117).

A technique of applying a multilayer film deposition IRCF to glass to be bonded in the CSP structure can be analogized in the past structure and has been studied (see, Japanese Patent Application Laid-open Nos. 2006-210888 and 2005-26314).

However, in an actual structure, the multilayer film deposition IRCF is configured by laminating several tens of multiple layers to satisfy spectral characteristics of visible light, so in the case of being configured on one surface of the sealing glass, a large warp is generated due to a film formation stress.

For this reason, the glass with the formed IRCF and Si of the sensor are difficult to be bonded with each other, and if the bonding can be performed, the large warp is generated. Thus, when the TSV is formed, a transfer of an apparatus for a process and chucking are interfered and difficult to be attained.

In view of the above-mentioned circumstances, it is desirable to provide an image pickup apparatus and a camera module which are capable of suppressing the warp and the generation of the flare light and obtaining a high quality image with the flare light less obvious even if a bright light source enters a field of vision.

According to an embodiment of the present disclosure, there is provided an image pickup apparatus, including an optical sensor including a light receiving unit, a sealing material configured to protect the optical sensor on a side of the light receiving unit, an intermediate layer formed at least between the light receiving unit and a first surface of the sealing material, the first surface being an opposed surface to the light receiving unit, and a control film configured to cause a cutoff wavelength to shift to a short wave side in accordance with an incident angle of light that is incident thereon obliquely, in which the control film includes a first control film formed on the first surface of the sealing material, the first surface being the opposed surface to the light receiving unit, and a second control film formed on a second surface of the sealing material, the second surface being opposite to the first surface.

According to another embodiment of the present disclosure, there is provided a camera module including an optical sensor including a light receiving unit, a sealing material configured to protect the optical sensor on a side of the light receiving unit, an intermediate layer formed at least between the light receiving unit and a first surface of the sealing material, the first surface being an opposed surface to the light receiving unit, a control film configured to cause a cutoff wavelength to shift to a short wave side in accordance with an incident angle of light that is incident thereon obliquely, and a lens configured to form a subject image on the light receiving unit of the optical sensor, in which the control film includes a first control film formed on the first surface of the sealing material, the first surface being the opposed surface to the light receiving unit, and a second control film formed on a second surface of the sealing material, the second surface being opposite to the first surface.

According to the embodiments of the present disclosure, it is possible to suppress the warp and the generation of the flare light and obtain a high quality image with the flare light less obvious even if the bright light source enters the field of vision.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure will be described with reference to the drawings.

It should be noted that the description is given in the following order.
1. Structural example of image pickup apparatus
2. Structure and function of control film (multilayer film)
3. Structural example of camera module <1. Structural Example of Image Pickup Apparatus>

Figure 6:
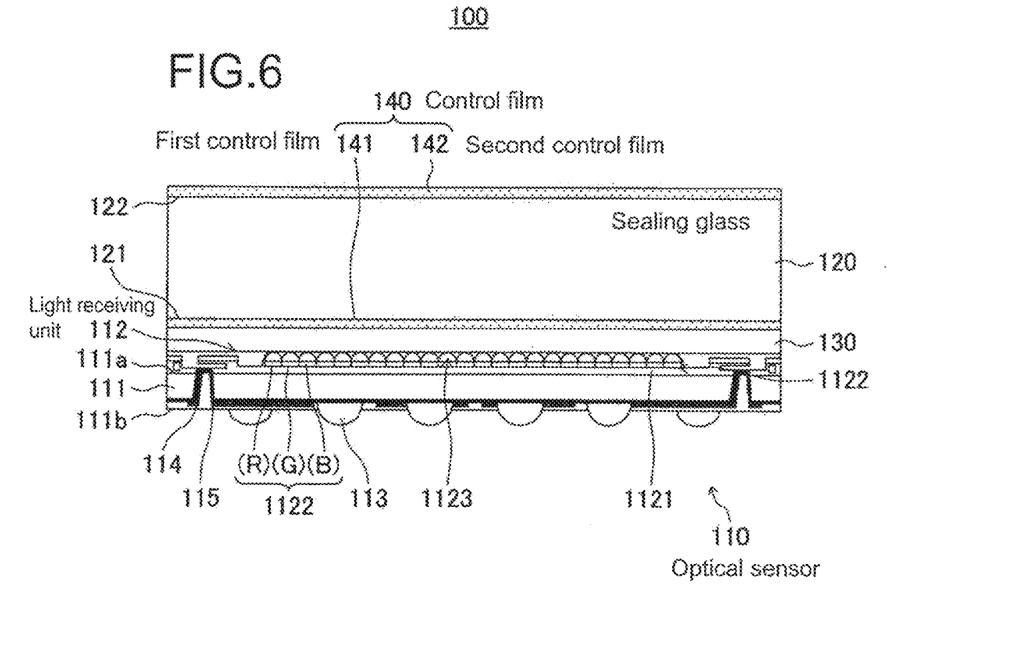
FIG. 6 is a diagram showing a structural example of an image pickup apparatus according to an embodiment of the present invention.

FIG. 6 is a diagram showing a structural example of an image pickup apparatus according to this embodiment.

In this embodiment, as an optical sensor, a CMOS image sensor (CIS) is applied, as an example.

An image pickup apparatus 100 according to this embodiment basically has a CSP structure in which packaging is performed in an optical sensor chip size, and has a cavityless CSP structure with no cavity in which an intermediate layer (resin in this embodiment) is formed between a sealing material for protecting a front surface (upper surface) of the optical sensor and the front surface.

In this embodiment, the front surface means an incident side of image light of a subject, on which a light receiving unit of the optical sensor of the image pickup apparatus is formed, and a back surface means a side on which light is not incident, and a connection electrode such as a bump is disposed.

The image pickup apparatus 100 includes an optical sensor 110, a sealing material 120, a resin layer 130 serving as an intermediate layer, and a control film 140.

In this embodiment, the control film 140 is constituted of a first control film between the resin layer 130 as the intermediate layer and the sealing material 120 and a second control film formed on the light incident surface (subject side surface) of the sealing material 120.

That is, the image pickup apparatus 100 according to this embodiment includes a first control film 141 disposed between the resin layer 130 and a first surface 121 of the sealing material 120 opposed thereto and a second control film 142 disposed on a second surface 122 opposed to the first surface of the sealing material, and has the structure in which a warp is suppressed.

As will be described later, the control film 140 is formed of a multilayer film, a cutoff wavelength of which is shifted to a short wave side in accordance with an incident angle of light that is incident on the film obliquely.

The image pickup apparatus 100 according to this embodiment can suppress a generation of flare light by the control film 140 and obtain a high quality image with the flare light less obvious, even if a bright light source enters the field of vision.

It should be noted that the resin layer 130 serving as the intermediate layer and the sealing material 120 are each formed of a transparent material with respect to light, which causes light to pass therethrough, and the materials have refractive indexes higher than that of air, e.g., approximately 1.5.

Further, in the structure shown in FIG. 6, the sealing material 120 is formed of glass as an example, and therefore the sealing material 120 may be referred to as sealing glass or cover glass in some cases.

In the optical sensor 110, a light receiving unit 112 is formed on the side of a front surface 111a of a sensor substrate 111, and a connection electrode 113 such as a bump (solder ball) is formed on the side of a back surface 111b thereof.

In the optical sensor 110, an electrode 115 is formed by a TSV (through silicon via) 114 that penetrates a sensor chip between the front surface and the back surface, thereby eliminating wirings using wire bond and making it possible to bonding glass in a wafer state in a clean room.

The light receiving unit 112 is formed on the first surface 111a of the sensor substrate 111 and has a light receiving surface (pixel array unit) 1121 on which a plurality of pixels (light receiving elements) are arranged in a matrix pattern.

In the light receiving unit 112, on the front surface side of the pixel array unit 1121, a color filter 1122 is formed.

Figure 7:
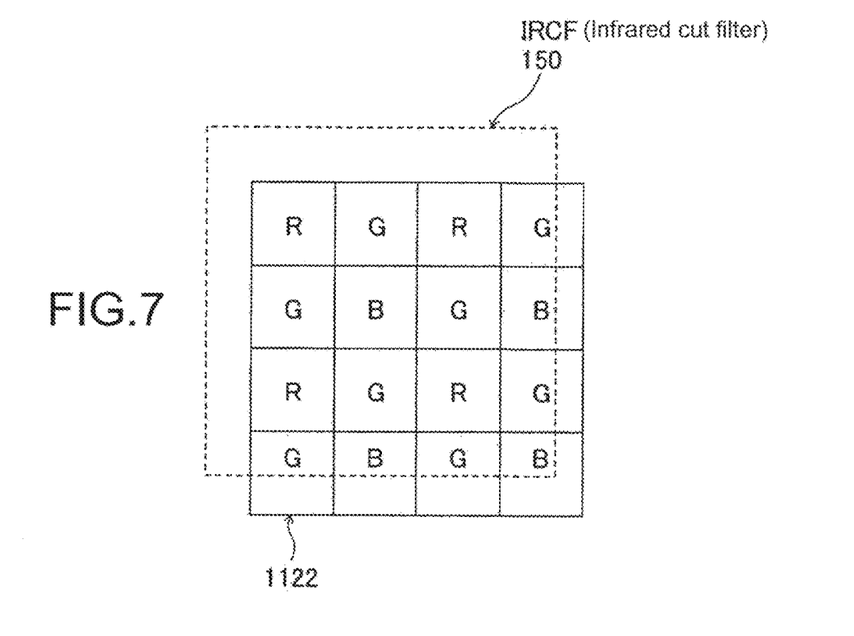
FIG. 7 is a diagram showing a structural example of a color filter according to the embodiment.

In the color filter 1122, color filters of three primary colors of R (red), G, (green), and B (blue) are formed in an array manner as on-chip color filters (OCCF) in the Bayer arrangement as shown in FIG. 7, for example. However, the arrangement pattern of the color filters is not limited to the Bayer arrangement.

It should be noted that, as in the example of FIG. 7, an infrared cut filter (IRCF) 150 is formed so as to be overlapped with the color filter 1122 in general.

In contrast, in this embodiment, the control film 140 doubles as the IRCF, and thus the structure is employed in which the IRCF is not provided in addition to the control film 140.

In the light receiving unit 112, a micro lens array 1123 for collecting incident light to pixels is arranged on the front surface side of the color filter 1122.

In the light receiving unit 112, on the front surface side of the micro lens array 1123, an antireflection film or the like is formed, for example.

The resin layer 130 serving as the intermediate layer is formed between the light receiving unit 112 having the above-mentioned structure and the first surface 121 of the sealing material (sealing glass) 120 which is opposed to the light receiving unit 112. The thickness of the resin layer 130 is set to approximately 50 μm. Further, the thickness of the sealing glass 120 is set to approximately 300 to 800 μm.

Further, the control film 140 has a function of shifting a cutoff wavelength to a short wave side in accordance with an incident angle of light that enters the film obliquely, and includes the first control film 141 and the second control film 142 as described above.

The first control film 141 is formed on the first surface 121, which is an opposed surface of the sealing material 120 with respect to the light receiving unit 112.

The second control film 142 is formed on the second surface 122, which is opposite to the first surface 121 of the sealing material 120.

In this way, in the cavityless CSP structure of this embodiment, in forming a reflection type multilayer film on the sealing glass so as to be integrated with the IRCF, a structure in which films are formed on both surfaces of the sealing glass 120 to suppress the warp is provided in order to perform a process in unit of a wafer.

Further, in this embodiment, on the first surface 121 of the sealing glass 120 which is close to the light receiving unit 112 serving as the sensor surface, a film for reflecting a cutoff half value of approximately 650 nm in the spectral characteristics is formed.

The basic structure of the image pickup apparatus 100 according to this embodiment is described above.

In the following, more specific structures and functions of the image pickup apparatus 100 will be described while focusing on the structure and function of the control film 140 which is a characteristic component of this embodiment and a reason why the control film is formed on the first surface and the second surface of the sealing glass 120.

<2. Structure and Function of Control Film (Multilayer Film)>

The control film 140 is a reflection type multilayer film and has a function of shifting the cutoff wavelength to a short wave side in accordance with an incident angle of light that obliquely enters the film.

In order to make it possible to suppress a generation of flare light and obtain a high quality image with the flare light less obvious even in the case where a bright light source enters a field of vision, it is necessary to form the control film on at least the first surface 121 side of the sealing glass 120.

First, in relation to the structure in which the control film is formed on only the first surface 121 side of the sealing glass 120, the structure and function of the control film (multilayer film) will be described.

Figures 8A, 8B:
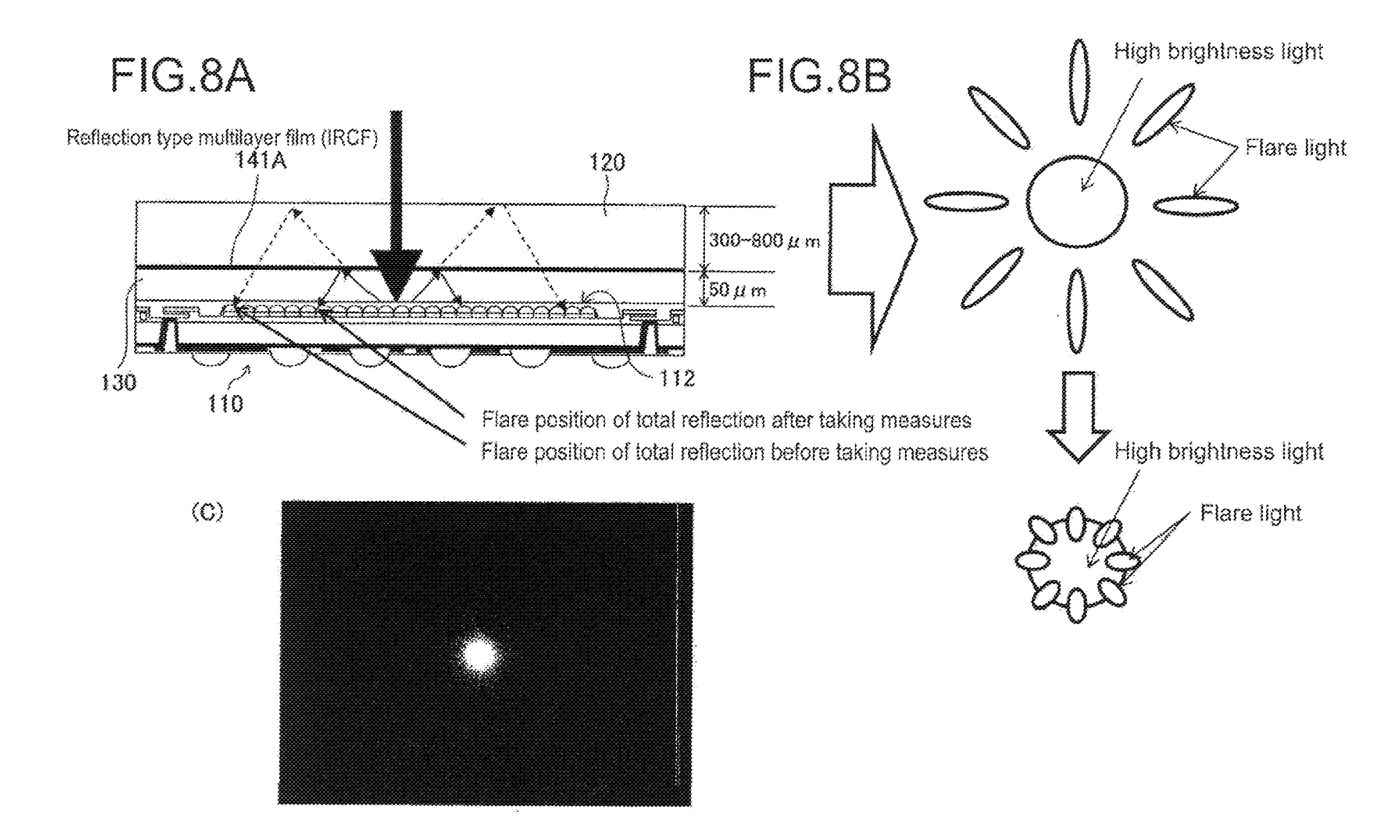
FIGS. 8 are diagrams for explaining an effect of suppressing the flare in the case where a control film is formed on an opposed surface of the sealing glass with respect to a light receiving unit.

FIGS. 8A to 8C are diagrams for explaining an effect of suppressing the flare in the case where the control film is formed on the opposed surface of the sealing glass with respect to the light receiving unit.

FIGS. 8A shows a schematic structure, FIG. 8B shows a conceptual diagram of an image which is obtained after taking measures, and FIG. 8C shows a diagram showing an image by the control film (multilayer film).

As a measure for suppressing the flare light, as shown in FIG. 8A, on the first surface (lower surface) 121 of the sealing glass 120, when a reflection type multilayer film 141A which functions as a reflection type multilayer film (IRCF) is disposed, the state of the flare light is as shown in FIG. 8B.

That is, light reflected on the optical sensor 110 is mostly reflected on the lower surface of the sealing glass. Accordingly, a problem of causing the phase of the flare light to be largely shifted to high brightness light is overcome, because the phase becomes significantly small, and the flare light is combined with the high brightness light, as shown in FIG. 8B.

FIG. 8C shows an image of the flare state after taking the measures. There is no specific flare of the total reflection as shown in FIG. 5B.

Figures 9A, 9B:
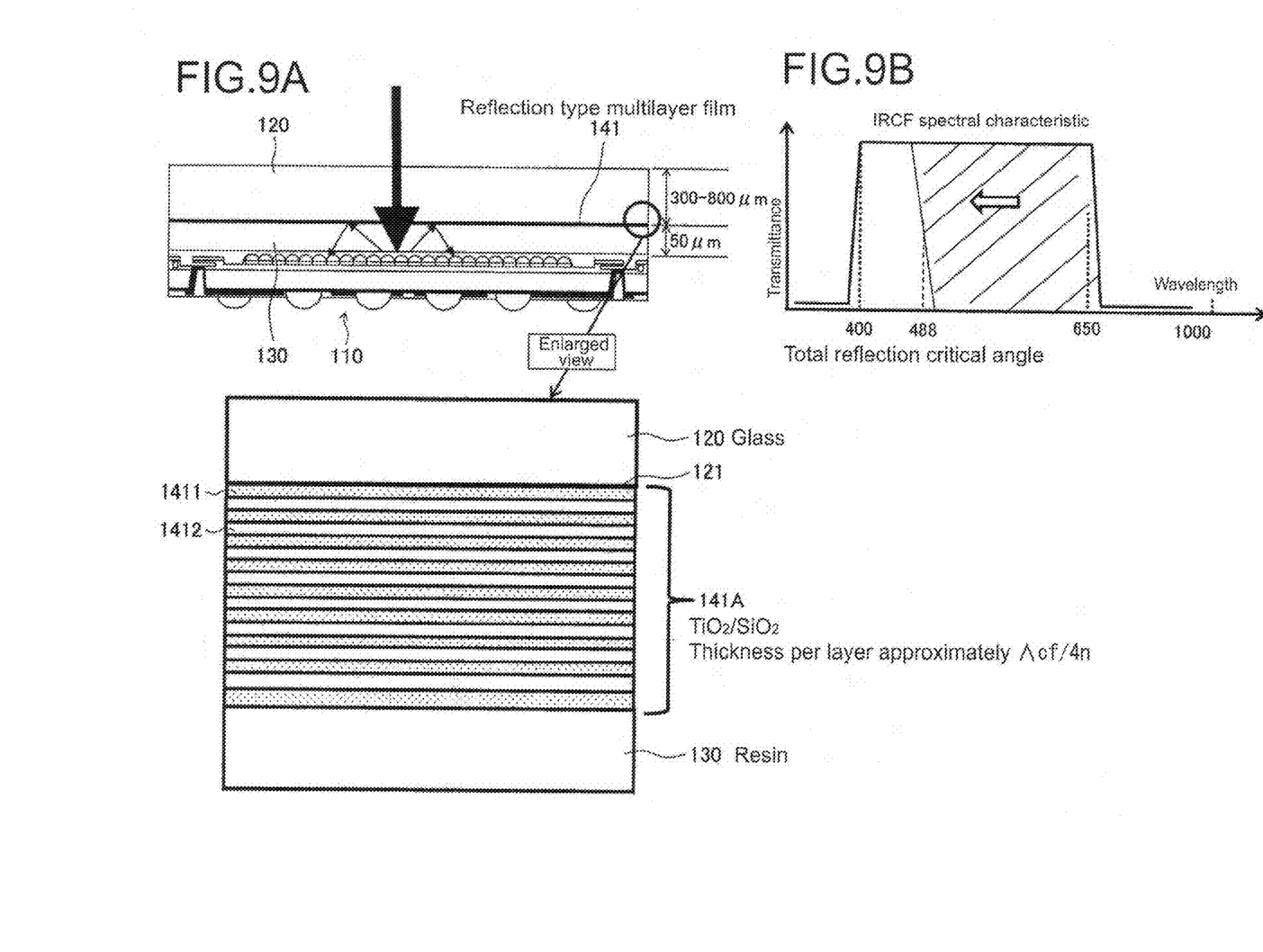
FIGS. 9 are diagrams showing an example of a film structure of the multilayer film formed on a first surface of the sealing glass according to the embodiment and a characteristic example thereof.

FIGS. 9A and 9B are diagrams showing an example of a film structure of the multilayer film formed on the first surface of the sealing glass according to this embodiment and a characteristic example thereof. FIG. 9A shows the film structure example, and FIG. 9B shows the characteristic example of the multilayer film.

The control film 140 is formed of the multilayer film 141A of a plurality of films having different refractive indexes.

In the multilayer film 141A, two or more kinds of film materials are disposed with a material having a high refractive index and a material having a low refractive index disposed alternately in the stated order. The multilayer film 141A is formed so that a refractive index difference Δ between a maximum refractive index of a film material and a minimum refractive index of a film material out of the two or more kinds of film materials is larger than 0.5.

In the multilayer film 141A, six or more films each having a thickness of 50 nm to 150 nm are disposed.

In this example, in the multilayer film 141A, as a multilayer film material, a first film 1411 having a high refractive index is made of $TiO_2$, a second film 1412 having a low refractive index is made of $SiO_2$, and the multilayer film 141A includes 17 layers in which the first film 1411 and the second film 1412 are alternately disposed.

FIG. 9A shows optical characteristics which can be attained when the multilayer film 141A including the 17 layers is formed, and the cutoff wavelength is set to 650 nm.

That is, the multilayer film 141A as the control film 140 includes a function as an infrared cut filter IRCF that cuts off light in an infrared region.

As shown in FIG. 9A, when the IRCF of the reflection type multilayer film 141A is disposed on the first surface (lower surface) 121 of the sealing glass 120, light is mostly reflected on the first surface 121. The principle is as follows.

A typical spectral characteristic of the IRCF is causing visible light to pass therethrough and cutting light other than that as shown in FIG. 9B.

In particular, a cutoff on a long wave side is designed to be a half value around a wavelength of 650 nm.

Out of light from the front side (second surface 122 side), only visible light passes therethrough as the spectral characteristic.

The multilayer film 141A shifts a cutoff wavelength to a short wave side for light that is obliquely incident thereon in accordance with the incident angle, as described above.

This causes a high-order diffraction component that contributes to the total reflection out of reflection diffraction light from the optical sensor to be selectively reflected on a multilayer film part to prevent dispersion of the flare light.

In general, the shift of the cutoff frequency is represented by the following expression.

$$\lambda CF(\theta) = \lambda CF(0) * \cos(\theta) \quad (2)$$

where θ represents the incident angle, $\lambda CF(\theta)$ represents the cutoff wavelength of the incident angle θ, and $\lambda CF(0)$ represents the cutoff wavelength of the incident angle 0 degree.

Here, if the assumption is made that ng=1.51, the critical angle θtir=41 deg is obtained from the above expression (1). When the critical angle of 41 deg is substituted into θ in the above expression (2), the cutoff wavelength of the flare by the total reflection is determined as $\lambda CF(\theta tir) \approx 488$ nm. Thus, it is possible to estimate that the multilayer film is effective as the measure against the flare with respect to at least a visible range of 488 nm or more.

A shaded area of the spectral characteristic shown in FIG. 9B represents light that can be reflected.

For the IRCF of the reflection type multilayer film, the multilayer film of 30 to 60 layers is necessary to obtain the spectral characteristic shown in FIG. 9B.

As described above, by forming the control film (multilayer film) on at least the first surface 121 side of the sealing glass 120, it is possible to suppress the generation of the flare light and obtain a high quality image with the flare light less obvious even in the case where a bright light source enters the field of vision.

Figure 10:
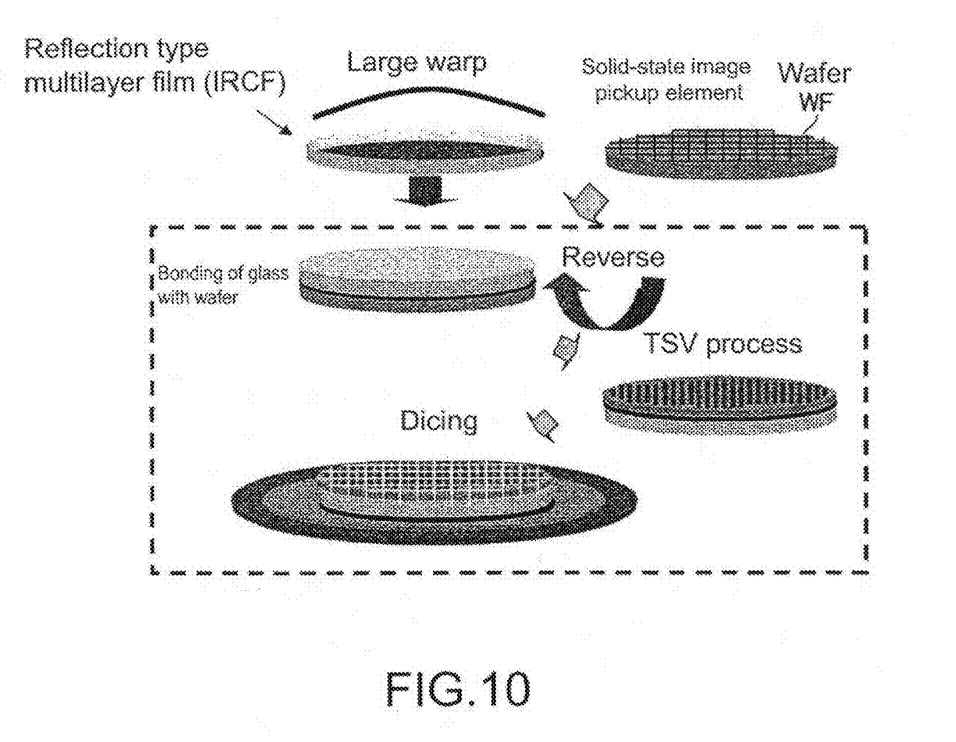
FIG. 10 is a diagram for explaining that the warp may be generated in the case where the multilayer film is formed only on the first surface side of the sealing glass.

Incidentally, if the film including the 30 to 60 layers is formed on the first surface (lower surface) 121 of the sealing glass 120, a stress which does not matter in the case of only a sensor size affects a step of a wafer level CSP in which a process is performed in unit of a wafer WF as shown in FIG. 10.

When the film is formed in size of 8 inch or 12 inch, a large warp is generated due to the stress. Therefore, in a step of performing bonding with sensor Si and a TSV process, the process may be difficult to be performed due to the large warp.

Figures 11A, 11B:
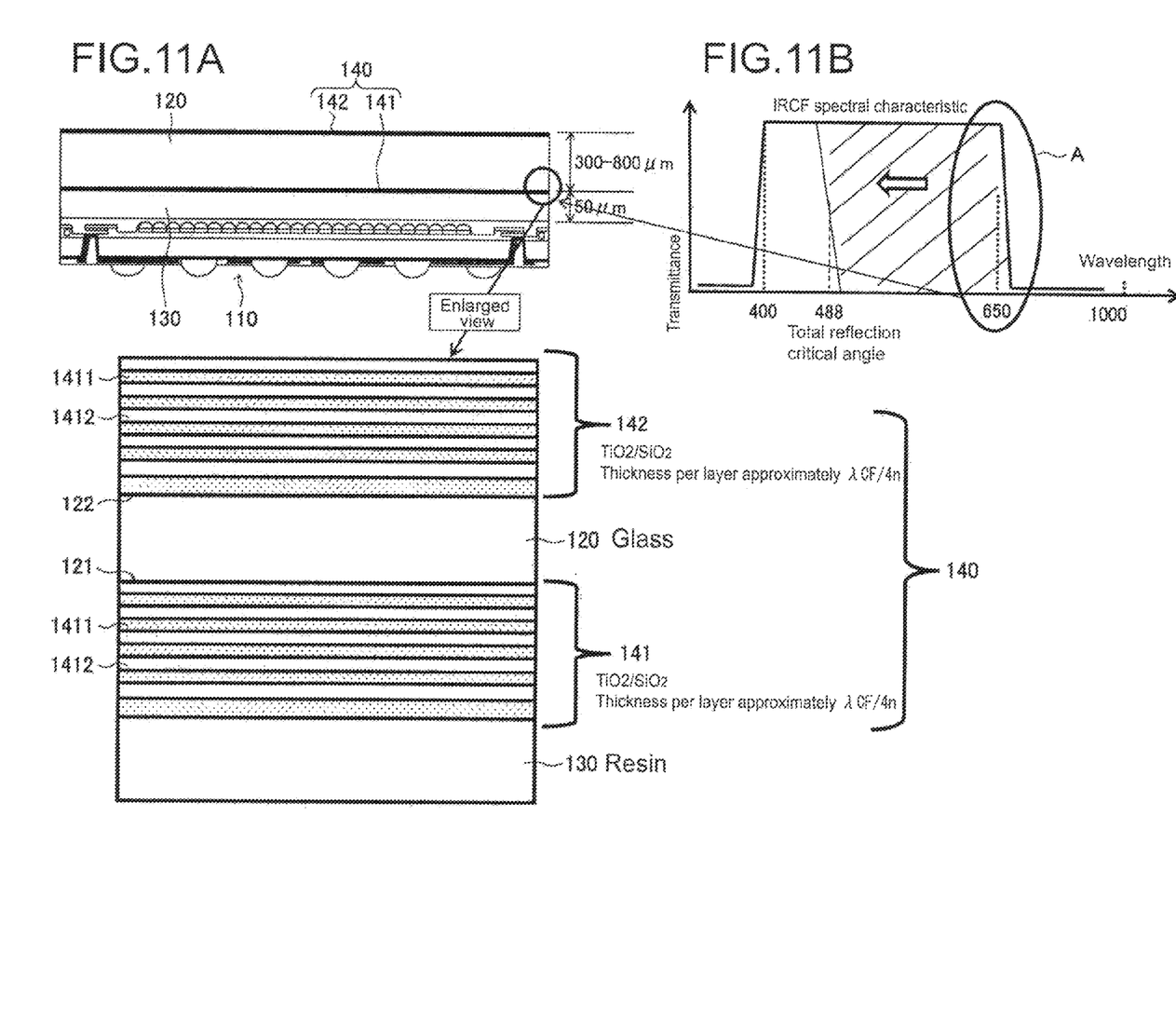
FIGS. 11 are diagrams showing an example of a film structure of the multilayer film according to the embodiment which is formed on the first surface and a second surface of the sealing glass and a characteristic example thereof.

FIGS. 11A and 11B are diagrams showing an example of a film structure of the multilayer film according to this embodiment which is formed on the first surface and the second surface of the sealing glass and a characteristic example thereof. FIG. 11A shows the example of the film structure, and FIG. 11B shows the characteristic example of the multilayer film.

In this embodiment, as a measure against the warp, as shown in FIG. 11A, on both the first surface 121 and the second surface 122 of the sealing glass 120, the control films (multilayer films) 141 and 142 are applied, respectively, to sort the number of films so that the stress of the warp is balanced.

At this time, a layer that determines a spectral characteristic in the vicinity of a cutoff half value of 650 nm indicated by the circle area A of FIG. 11B is disposed on the first surface (lower surface) 121 of the sealing glass.

With this structure, the reflection type multilayer films are disposed on the both surfaces of the sealing glass without changing the position of the film that reflects the flare on the first surface (lower surface) of the sealing glass, thereby making it possible to balance the stress of the warp and suppress the warp.

As a result, even in the case of the wafer level size (8 inch or 12 inch), it is possible to perform the process of TSV on the glass with the IRCF without any difficulty.

As described above, by the image pickup apparatus according to this embodiment, it is possible to obtain the following effect.

The deposition type IRCF of the control film as the multilayer film is formed on each surface, thereby making it possible to suppress the warp. Therefore, the IRCF can be directly formed on the glass with the CSP structure. Thus, it is possible to reduce the thickness and size of the CSP and reduce the cost thereof as compared to a structure in which the IRCF is bonded with another part.

As the measure against the flare of the total reflection of the high brightness light, which is a problem of the cavity CSP, the reflection on the lower surface of the glass is possible, so the arrangement on the lower surface of the glass which is very close to the optical sensor surface is carried out.

Thus, when the thickness of the glass is set to 500 μm, and a bonding thickness is set to 50 μm, a phase difference is determined as (50×2)/(50×2+500×2)=1/11, which is approximately 1/10 and close to the high brightness light.

As a result, it is possible to apply the cavityless CSP to a large optical sensor and achieve the reduction in size and weight of a camera.

As described above, by the image pickup apparatus of according to this embodiment, it is possible to suppress the warp and the generation of the flare light, and obtain a high quality image with the flare light less obvious even in the case where a bright light source enters the field of vision.

More specifically, according to this embodiment, by using the control films (IRCF) formed on both surfaces of the sealing glass for a wafer level CSP having the cavityless structure, the following effect can be obtained.

Because the warp is small, there is no problem in a function for a work maintenance such as a vacuum adsorption and an electrostatic chuck of an apparatus in the CSP manufactured in a wafer level.

Because the warp is small, optical accuracy of the sensor is high.

Because the warp is small, a remaining stress of an insulation film ($SiO_2$) or a Cu film becomes small.

Because a completed CSP includes bonded glass having the IRCF function, it is possible to reduce a part as compared to the case where the IRCF is optically provided as an additional part and reduce a cost and a thickness of a set.

Further, in the film formation of the IRCF on both surfaces of the sealing glass, the spectral characteristic in the vicinity of the half value of 650 nm is provided on the lower surface (first surface) of the sealing glass which is close to the sensor, with the result that the following effect is obtained.

That is, with respect to reflection light on the OCL of incident light having a high brightness, the flare totally reflected on the upper surface of the glass is mostly reflected on the lower surface of the glass, so the phase becomes close to that of the light having the high brightness, which makes the flare less obvious.

The image pickup apparatus 100 described above can be applied to a camera module having an image pickup lens.

<3. Structural Example of Camera Module>

Figure 12:
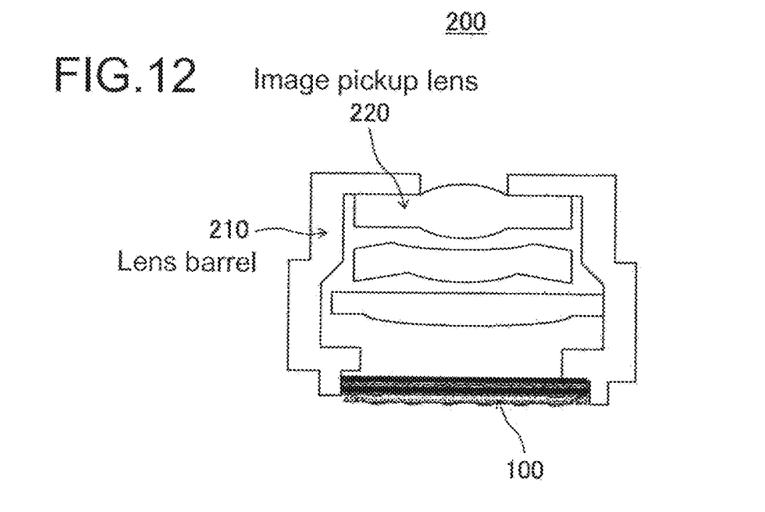
FIG. 12 is a diagram showing a structural example of a camera module according to the embodiment.

FIG. 12 is a diagram showing a structural example of a camera module according to this embodiment.

In a camera module 200, on a front surface side (subject side) of a lens barrel 210 of the image pickup apparatus 100, an image pickup lens 220 that forms a subject image on the light receiving unit 112 of the optical sensor 110 is disposed.

The camera module 200 has a signal processing unit (not shown) or the like in addition to the image pickup lens 220.

In the camera module 200 having the above structure, light from the subject which is taken by the image pickup lens 220 is subjected to an optical process in the light receiving unit so as to be easily converted into an electric signal in the image pickup apparatus. After that, the light is guided to a photoelectric conversion unit of the optical sensor 110, and an electric signal obtained by the photoelectric conversion is subjected to predetermined signal processing in the subsequent signal processing unit.

Also in the camera module according to this embodiment, it is possible to suppress the generation of the flare light and obtain a high quality image with the flare light less obvious even in the case where a bright light source enters the field of vision.

Figure 13:
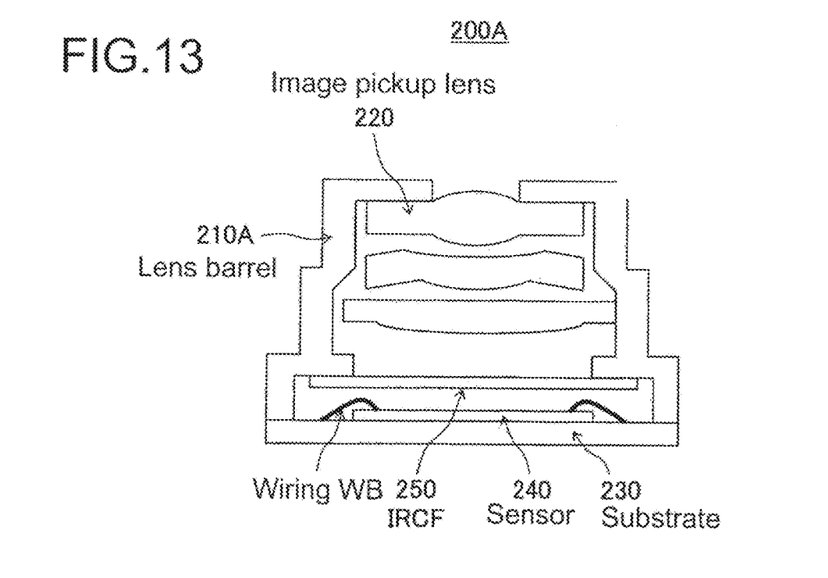
FIG. 13 is a diagram showing a structural example of a typical camera module.

FIG. 13 is a diagram showing a structural example of a typical camera module.

In a typical camera module 200A shown in FIG. 13, a substrate 230 and an optical sensor 240 are disposed on an optical sensor disposition area of a lens barrel 210A, and the substrate 230 and the optical sensor 240 are electrically connected with each other by wire bond WB of a wiring.

An IRCF 250 is disposed so as to be opposed to a light receiving surface 241 of the optical sensor 240.

As compared to the typical camera module 200A shown in FIG. 13, for the camera module 200 using the CSP with the IRCF according to this embodiment, an IRCF as an addition part, a substrate, and a wiring WB are unnecessary, so a part structure is small, making it possible to reduce the size and thickness.

It should be noted that the present disclosure can take the following configurations.

(1) An image pickup apparatus, including:
an optical sensor including a light receiving unit;
a sealing material configured to protect the optical sensor on a side of the light receiving unit;
an intermediate layer formed at least between the light receiving unit and a first surface of the sealing material, the first surface being an opposed surface to the light receiving unit; and
a control film configured to cause a cutoff wavelength to shift to a short wave side in accordance with an incident angle of light that is incident thereon obliquely, in which
the control film includes a first control film formed on the first surface of the sealing material, the first surface being the opposed surface to the light receiving unit, and a second control film formed on a second surface of the sealing material, the second surface being opposite to the first surface.

(2) The image pickup apparatus according to Item (1, in which
the first control film includes a function as an infrared cut filter configured to cut off light in an infrared region.

(3) The image pickup apparatus according to Item (1) or (2), in which
the control film is formed of a multilayer film of a plurality of films, refractive indexes of which are different, and
the first control film and the second control film are formed by sorting the number of films so that a stress of a warp is balanced.

(4) The image pickup apparatus according to Item (3), in which
the multilayer film is obtained by disposing two or more kinds of film materials with a film material having a high refractive index and a film material having a low refractive index being alternated in a stated order.

(5) A camera module, including:
an optical sensor including a light receiving unit;
a sealing material configured to protect the optical sensor on a side of the light receiving unit;
an intermediate layer formed at least between the light receiving unit and a first surface of the sealing material, the first surface being an opposed surface to the light receiving unit;
a control film configured to cause a cutoff wavelength to shift to a short wave side in accordance with an incident angle of light that is incident thereon obliquely; and
a lens configured to form a subject image on the light receiving unit of the optical sensor, in which
the control film includes a first control film formed on the first surface of the sealing material, the first surface being the opposed surface to the light receiving unit, and a second control film formed on a second surface of the sealing material, the second surface being opposite to the first surface.

(6) The camera module according to Item (5), in which
the first control film includes a function as an infrared cut filter configured to cut off light in an infrared region.

(7) The camera module according to Item (5) or (6), in which
the control film is formed of a multilayer film of a plurality of films, refractive indexes of which are different, and
the first control film and the second control film are formed by sorting the number of films so that a stress of a warp is balanced.

(8) The camera module according to Item (7), in which
the multilayer film is obtained by disposing two or more kinds of film materials with a film material having a high refractive index and a film material having a low refractive index being alternated in a stated order.

The present disclosure contains subject matter related to that disclosed in Japanese Priority Patent Application JP 2011-177136 filed in the Japan Patent Office on Aug. 12, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image pickup apparatus, comprising:
an optical sensor including a light receiving unit;
a sealing material configured to protect the optical sensor on a side of the light receiving unit;
an intermediate layer formed at least between the light receiving unit and a first surface of the sealing material, the first surface being an opposed surface to the light receiving unit; and
a control film configured to cause a cutoff wavelength to shift to a short wave side in accordance with an incident angle of light that is incident thereon obliquely, wherein
the shift of the cutoff frequency satisfies the following condition:

$$\lambda CF(\theta) = \lambda CF(0) * \cos(\theta)$$

where $\theta$ represents the incident angle, $\lambda CF(\theta)$ represents the cutoff wavelength of the incident angle $\theta$, and $\lambda CF(0)$ represents the cutoff wavelength of the incident angle 0 degrees, and
the control film includes a first control film that is a multilayer film formed on the first surface of the sealing material, the first surface being the opposed surface to the light receiving unit, and a second control film formed on a second surface of the sealing material, the second surface being opposite to the first surface.

2. The image pickup apparatus according to claim 1, wherein
the first control film includes a function as an infrared cut filter configured to cut off light in an infrared region.

3. The image pickup apparatus according to claim 1, wherein
the control film is formed of a multilayer film of a plurality of films, refractive indexes of which are different, and
the first control film and the second control film are formed by sorting the number of films so that a stress of a warp is balanced.

4. The image pickup apparatus according to claim 3, wherein
the multilayer film is obtained by disposing two or more kinds of film materials with a film material having a high refractive index and a film material having a low refractive index being alternated in a stated order.

5. A camera module, comprising:
an optical sensor including a light receiving unit;
a sealing material configured to protect the optical sensor on a side of the light receiving unit;
an intermediate layer formed at least between the light receiving unit and a first surface of the sealing material, the first surface being an opposed surface to the light receiving unit;
a control film configured to cause a cutoff wavelength to shift to a short wave side in accordance with an incident angle of light that is incident thereon obliquely; and a lens configured to form a subject image on the light receiving unit of the optical sensor, wherein the shift of the cutoff frequency satisfies the following condition:

$$\lambda CF(\theta)=\lambda CF(0)*\cos(\theta)$$

where $\theta$ represents the incident angle, $\lambda CF(\theta)$ represents the cutoff wavelength of the incident angle $\theta$, and $\lambda CF(0)$ represents the cutoff wavelength of the incident angle 0 degrees, and the control film includes a first control film that is a multilayer film formed on the first surface of the sealing material, the first surface being the opposed surface to the light receiving unit, and a second control film formed on a second surface of the sealing material, the second surface being opposite to the first surface.

6. The camera module according to claim 5, wherein the first control film includes a function as an infrared cut filter configured to cut off light in an infrared region.

7. The camera module according to claim 5, wherein the control film is formed of a multilayer film of a plurality of films, refractive indexes of which are different, and the first control film and the second control film are formed by sorting the number of films so that a stress of a warp is balanced.

8. The camera module according to claim 7, wherein the multilayer film is obtained by disposing two or more kinds of film materials with a film material having a high refractive index and a film material having a low refractive index being alternated in a stated order.

* * * * *